(12) United States Patent
Heinrichsdorff et al.

(10) Patent No.: US 7,935,608 B2
(45) Date of Patent: May 3, 2011

(54) STORAGE CELL HAVING A T-SHAPED GATE ELECTRODE AND METHOD FOR MANUFACTURING THE SAME

(75) Inventors: Frank Heinrichsdorff, Mahlow (DE); Nicolas Nagel, Dresden (DE); Jens-Uwe Sachse, Dresden (DE); Andreas Voerckel, Dresden (DE); Dominik Olligs, Dresden (DE); Torsten Mueller, Dresden (DE)

(73) Assignee: Qimonda AG, Munich (DE)

( * ) Notice: Subject to any disclaimer, the term of this patent is extended or adjusted under 35 U.S.C. 154(b) by 52 days.

(21) Appl. No.: 12/131,794

(22) Filed: Jun. 2, 2008

(65) Prior Publication Data

US 2009/0294825 A1 Dec. 3, 2009

(51) Int. Cl.
*H01L 21/76* (2006.01)
(52) U.S. Cl. .............. 438/424; 438/427; 257/E21.011
(58) Field of Classification Search .................. 438/424, 438/427; 257/E21.011
See application file for complete search history.

(56) References Cited

U.S. PATENT DOCUMENTS

| | | | |
|---|---|---|---|
| 7,579,244 B2 * | 8/2009 | Lee | 438/270 |
| 2002/0093073 A1 * | 7/2002 | Mori et al. | 257/510 |
| 2006/0292802 A1 * | 12/2006 | Lee et al. | 438/264 |

* cited by examiner

*Primary Examiner* — Matthew S Smith
*Assistant Examiner* — John M Parker
(74) *Attorney, Agent, or Firm* — Patterson & Sheridan, LLP

(57) ABSTRACT

A method for manufacturing an integrated circuit including at least one storage cell is provided. The method includes providing a substrate having a first and second side, and a plurality of parallel trenches so that a dividing wall is formed between adjacent trenches, filling the trenches with an insulating compound, providing a first insulating layer having a first and second side on the top surface of the dividing wall, wherein the first side is arranged on the substrate's first side, providing a first conductive layer having a first and second side, wherein the first side is arranged on the insulating layer's second side, wherein the conductive layer protrudes from the substrate surface, providing a second conductive layer having a first and second side, wherein the first side is located on the first conductive layer's second side, and removing parts of the second conductive layer by an anisotropic etching means.

15 Claims, 6 Drawing Sheets

A - A

STORAGE CELL HAVING A T-SHAPED GATE ELECTRODE AND METHOD FOR MANUFACTURING THE SAME

BACKGROUND OF THE INVENTION

1. Field of the Invention

The invention relates to the field of integrated circuits, in particular to the field of integrated circuits including at least one storage cell.

2. Description of the Related Art

Integrated circuits may have a plurality of storage cells arranged in a matrix-like manner in order to store a plurality of logical values. The logical values stored on an integrated circuit may form a digital signal which may represent user-defined data. In some cases, a storage cell may comprise a floating gate, which can store an electronic charge for extended periods of time, even without a connection to a power supply.

SUMMARY OF THE INVENTION

Embodiments of the invention relate to a method for manufacturing an integrated circuit including at least one storage cell, the method including the step of providing a substrate having a first side and an opposing second side, the substrate including a plurality of trenches substantially parallel to each other so that at least one dividing wall is formed between two adjacent trenches, filling the trenches with an insulating compound and providing a first insulating layer having a first side and an opposing second side on the top surface of at least one dividing wall between a first trench and a second trench, wherein the first side of the first insulating layer is arranged on the first side of the substrate. Furthermore, the method includes the step of providing a first conductive layer having a first side, an opposing second side, and side faces arranged from the first side and second side of the first conductive layer, wherein the first side of the first conductive layer is arranged on the second side of the insulating layer and the conductive layer is protruding at least partly from the substrate surface, providing a second conductive layer having a first side and an opposing second side, wherein the first side of the second conductive layer is located at least partly on the second side of the first conductive layer and the side faces of the first conductive layer, and removing parts of the second conductive layer by means of an anisotropic etching.

In another embodiment, the invention relates to an integrated circuit including a substrate and at least one storage cell. The substrate includes a plurality of trenches. The at least one storage cell is formed on the substrate and includes at least one first insulating layer having at least a first side and an opposing second side, wherein the first side is arranged on the surface of the substrate and covers at least a part of the surface of the substrate which is located between a first trench and a second trench. The at least one storage cell further includes a floating gate, comprising a first conductive layer disposed on the second side of the at least one first insulating layer which protrudes from the substrate surface, and a second conductive layer disposed at least on a subsurface of the first conductive layer, a portion of the second conductive layer having been removed by means of an anisotropic etching process.

BRIEF DESCRIPTION OF THE DRAWINGS

For a more complete understanding of the present invention and the advantages thereof, reference is made to the following description taken in conjunction with the accompanying drawings in which.

DETAILED DESCRIPTION OF THE PREFERRED EMBODIMENT

Figure 1:
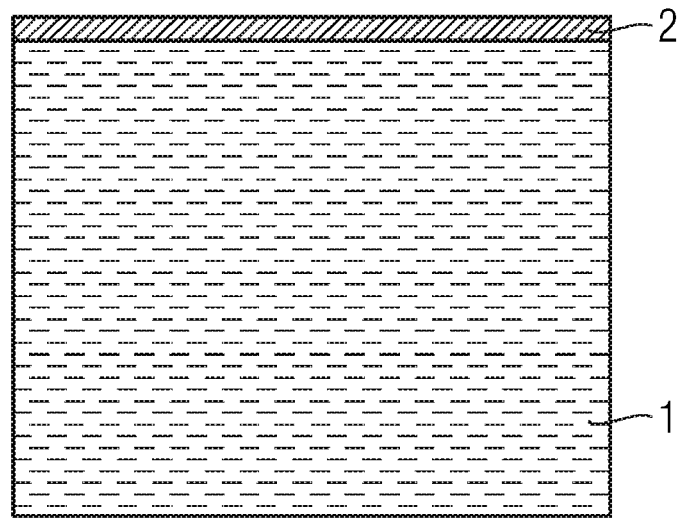
FIGS. 1 to 10 illustrate cross-sectional views through a part of a semiconductor die after some method steps during manufacturing of a storage cell have been completed, according to one embodiment of the invention. The cross-sectional view is carried out in the direction of a word line.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

Moreover, inventive aspects lie in less than all features of a single disclosed embodiment. Thus, the claims following the detailed description are hereby expressly incorporated into this detailed description, with each claim standing on its own as a separate embodiment of this invention.

FIG. 1 shows a cross-sectional view through a part of a semiconductor substrate 1, according to one embodiment of the invention. The cross section is shown alongside a word line of the integrated circuit.

The substrate may have a thickness of 0.05 up to 0.3 mm. The substrate 1 may have an internal structure such as doped regions or buried insulating layers. The substrate 1 may be made from a single crystal die. The substrate 1 has a first side and an opposing second side. The surface of the substrate may be substantially planar, i.e. no trenches, steps or trenches are present which exceed about 10 nm in height. The semiconductor substrate 1 may be made of silicon, germanium, gallium arsenide or the like. In any case, it may include further chemical elements or molecules either as a dopant or as an unavoidable contamination. The substrate 1 may include a thin layer of a semiconductor material which is arranged on a further substrate made of glass or sapphire or the like.

At least on a part of the first surface of the substrate 1, a first insulating layer 2 may be provided. The first insulating layer 2 may include an oxide or a nitride. The insulating layer may consist of a plurality of insulating layers which are stacked one above the other on the substrate surface. The insulating layer may be manufactured by heating the substrate in a reactive gas atmosphere in order to form a silicon oxide or a silicon nitride compound. In another embodiment of the invention, the first insulating layer 2 may be provided by a physical vapor deposition. The first insulating layer 2 has a thickness of at least 1 nm up to 100 nm. The first insulating layer 2 may include further chemical elements or molecules either as a dopant or as an unavoidable contamination.

After completing the step of providing a first insulating layer 2, the insulating layer 2 has a first side and an opposing second side. The first side of the first insulating layer 2 is thereby bond to the first surface of the substrate 1.

Figure 2:
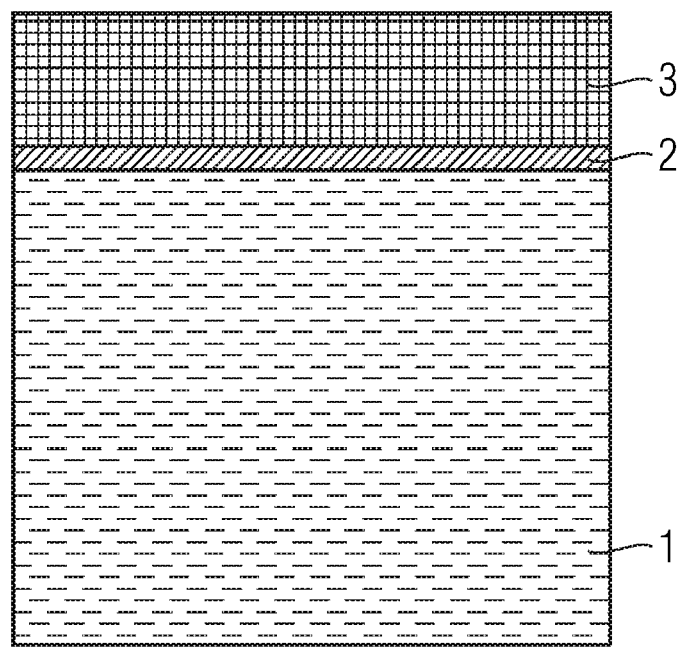

With reference to FIG. 2, a first conductive layer 3 may be provided in the next step, according to one embodiment of the invention. As shown, the conductive layer 3 has a first side and a second side. The first side of the conductive layer 3 may be arranged on the second side of the first insulating layer 2. The conductive layer 3 may include polycrystalline silicon which may include at least one dopant. The dopant may be selected from the group of boron, aluminum, gallium, nitrogen, phosphorus or arsenic. Furthermore, the conductive layer 3 may include further chemical elements which may constitute unavoidable contaminations. In another embodiment of the present invention, the first conductive layer 3 may include a metal or an alloy. The conductive layer may be obtained by chemical vapor deposition or physical vapor deposition. In another embodiment of the invention, the first conductive layer 3 may be provided by means of sputtering.

Figure 3:
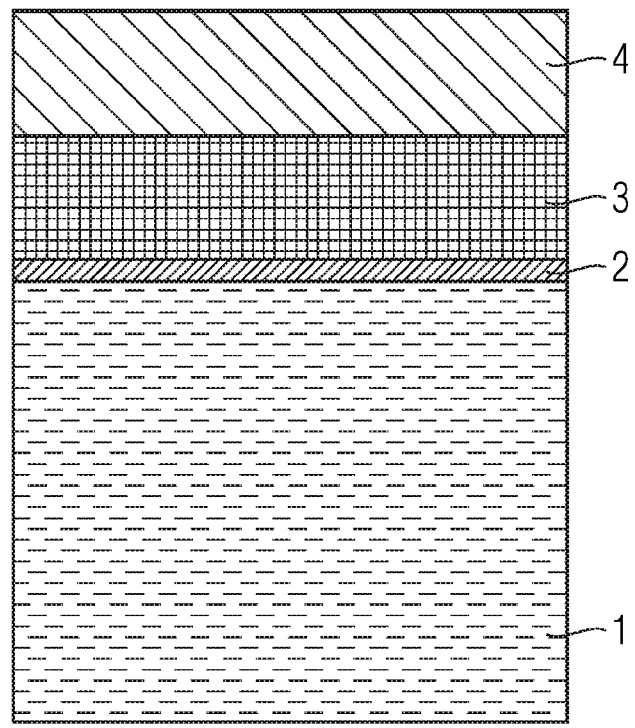

As illustrated in FIG. 3, a masking layer 4 may be provided on the second surface of the conductive layer 3, according to one embodiment of the invention. The masking layer 4 may include a photo-resist which may be applied by a spin-coating process.

In another embodiment, the masking layer 4 may be manufactured from a hard material such as a silicon nitride. The silicon nitride may have the stoichiometric composition of $Si_3N_4$ and may incorporate further constituents. In still another embodiment, the masking layer can be obtained from a carbon layer. In this case, it may be made from diamond like carbon or amorphous carbon. The masking layer 4 may be obtained by chemical vapour deposition, physical vapour deposition or reactive sputtering techniques.

Figure 4:
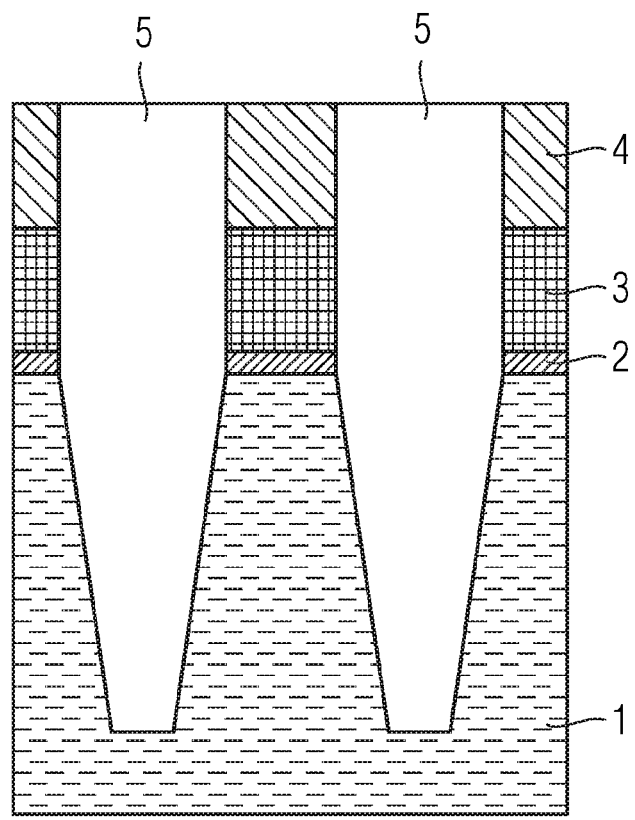

In one embodiment, subsequent to the deposition of the first insulating layer 2, the first conductive layer 3 and the masking layer 4, a structuring of the substrate 1 and the layers adhering thereon may be made. The result of this structuring is illustrated in FIG. 4.

The substrate 1 and the layers adhering thereon may be structured by means of a photo-resist which is provided on top of the masking layer 4. A pattern may be transferred to the photo-resist by means of a photolithography which is well-known to those skilled in the art. In another embodiment, the pattern may be transferred by any other lithographic method such as electron-beam lithography, ion-beam lithography or the like. The pattern applied may have a plurality of elongated parallel lines.

After exposure and processing of the photo-resist, subareas of the photo-resist corresponding to the pattern can be removed from the substrate 1 accommodating the first insulating layer 2, the first conductive layer 3 and the masking layer 4. The photo-resist may protect the layers under the photo-resist from etching agents applied subsequently.

In another embodiment, redundant parts of the masking layer 4 may be removed directly, e.g. by means of a laser ablation, without the use of a photo-resist. In this case, the masking layer 4 may protect parts of the substrate 1, the first insulating layer 2 and the first conductive layer 3 from the etching agents applied.

In still another embodiment, a photo-resist may protect the parts of the masking layer 4 covered by the photo-resist from etching agents which selectively etch the material of the masking layer 4 only. After this step has been completed, the photo-resist can be removed and the remaining parts of the masking layer 4 protect the covered parts of the substrate 1, the first insulating layer 2 and the first conductive layer 3 while etching these layers by means of at least one etching agent which does not affect the masking layer.

As shown in FIG. 4, if the pattern applied has a plurality of elongated parallel lines, trenches 5 may be formed by applying etching agents in order to remove redundant material and to form trenches 5 in the substrate 1, the first insulating layer 2, the first conductive layer 3 and the masking layer 4. The trenches 5 may have a depth of about 250 nm. The width of a trench 5 equals, in one embodiment of the invention, the size of one pitch. The pitch is herein after referenced as the size of a grid which gives the location of any topographic element of the integrated circuit. In one embodiment of the invention, the pitch may be 90 nm. In another embodiment of the invention, the pitch may be 65 nm. In still another embodiment, the pitch may be smaller than 65 nm, such as 45 nm, 36 nm or 21 nm. Between two neighbored trenches 5, a dividing wall may be formed. In one embodiment of the invention, the width of the dividing wall may also equal substantially the width of one pitch.

The trenches 5 may be, in one embodiment of the invention, formed by a plasma-assisted etching. In a plasma-assisted etching process, reactive particles from a single gas mixture may be used to solve particles of the masking layer 4, the first conductive layer 3, the first insulating layer 2 and the substrate 1.

In another embodiment of the invention, the etching of the trenches 5 may be performed in several steps. As an example, one etching process involving a first gas mixture may be used for removing the masking layer 4. Other etching processes involving other gas mixtures may be used for etching at least the first conductive layer 3 and the first insulating layer 2 and the substrate 1.

In still another embodiment, at least one plasma-assisted etching process may be substituted by a wet-chemical etching process.

Reactive gases for etching the trenches 5 may be selected from the group of Ar, $O_2$, $CHF_3$ and $CF_4$. A plasma used may have one or more of the constituents. Additionally, other gases not given in detail may be present.

Figure 5:
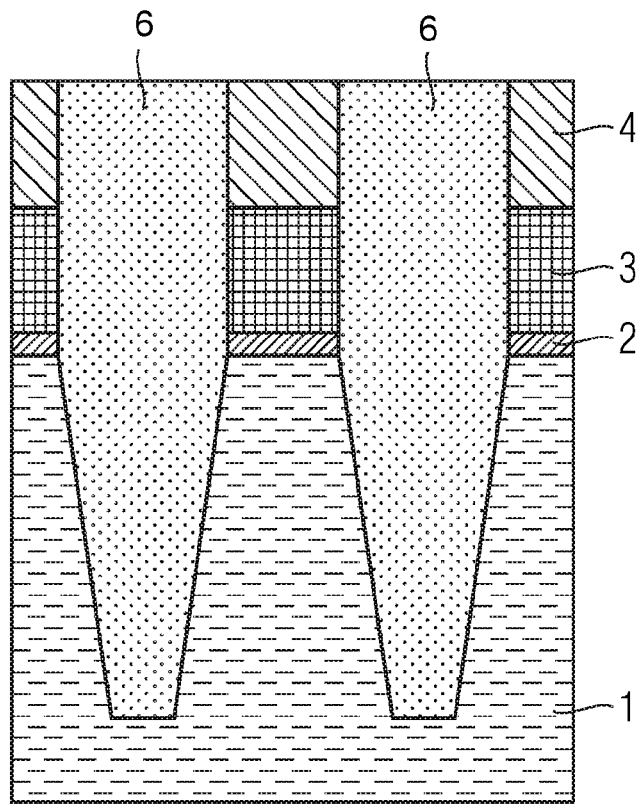

As illustrated in FIG. 5, the trenches 5 etched during the previous method step are refilled by an insulating compound 6, according to one embodiment of the invention. The insulating compound 6 used may be made from an oxide, e.g. a silicon oxide. The insulating compound 6 may be applied in the trenches 5 by means of a chemical vapor deposition process. In another embodiment of the invention, a spin-coating process may be used to fill the trenches 5 with an insulating compound 6.

In case that the insulating compound 6 protrudes from the masking layer 4, a polishing may be applied in order to level the surface of the insulating compound 6 and the masking layer 4, as shown in FIG. 5. For leveling the surface, a chemical-mechanical polishing may be applied. The method of chemical-mechanical-polishing is well-known to those skilled in the art and therefore not explained in detail here.

Figure 6:
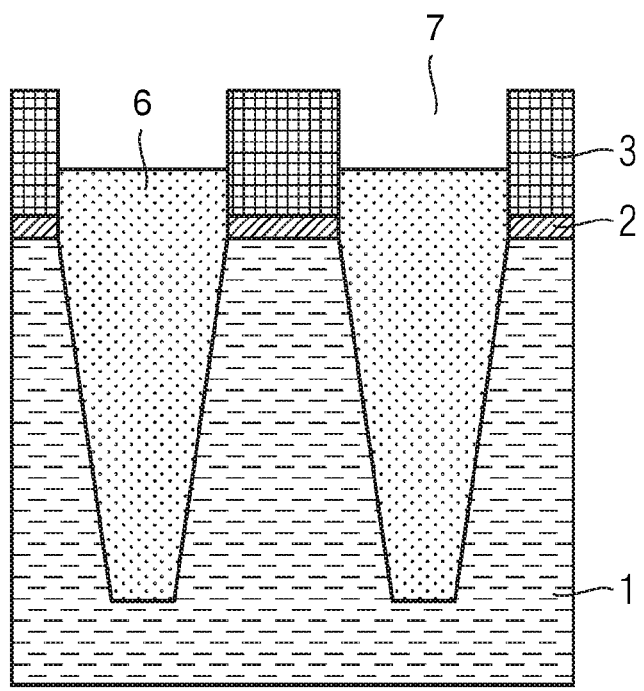

The next step, illustrated in FIG. 6, involves removing the masking layer 4, according to one embodiment of the invention. This may be performed by means of an etching process. In one embodiment of the invention, a wet-chemical etching may be applied. In another embodiment, a dry-etching process may be applied. Such a dry-etching process may be implemented by exposing the surface to a reactive gas phase or a plasma. The solvent used for the etching process may be selective to the material of the masking layer without affecting the first conductive layer 3 or the insulating compound 6.

In a further etching process, the insulating compound 6 is removed partly in order to form a recess 7 which is delimited by two adjacent remaining parts of the first conductive layer 3. Therefore, the remaining parts of the first conductive layer 3 may protrude from the surface of the insulating compound 6.

In one embodiment of the present invention, etching of the masking layer 4 and the insulating compound 6 may be performed by a single chemical etching process. In one embodiment of the invention, etching for removing parts of the insulating compound 6 may be carried out by means of a solvent which does not affect the material of the first conductive layer 3.

Figure 7:
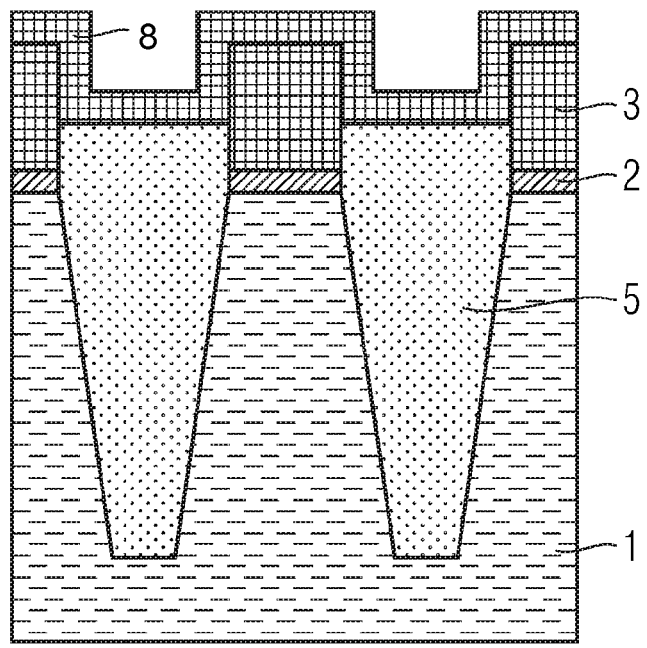

In a further step, a second conductive layer 8 may be provided, according to one embodiment of the invention, as shown in FIG. 7. This second conductive layer may cover at least the protruding parts of the first conductive layer 3. In another embodiment, the second conductive layer 8 may cover the full surface of the first conductive layer 3 and the insulating compound 6. The second conductive layer 8 may be made of the same material as the first conductive layer 3, i.e. a metal or an alloy or polycrystalline silicon to which a dopant may be added.

Also the second conductive layer 8 may be provided by means of a chemical vapor deposition process. In one embodiment of the invention, any of the first or the second conductive layers 3, 8 may be provided as an amorphous silicon layer which transforms in a polycrystalline silicon layer by annealing the substrate with any of the first or the second conductive layer thereon.

After the second conductive layer has been deposited on the surface of the subareas of the first conductive layer 3, an interface may be formed between the first conductive layer 3 and the second conductive layer 8. This interface may be visible by means of electron-microscopy even when the same chemical compound and the same deposition process has been used for the first conductive layer and the second conductive layer.

Figure 8:
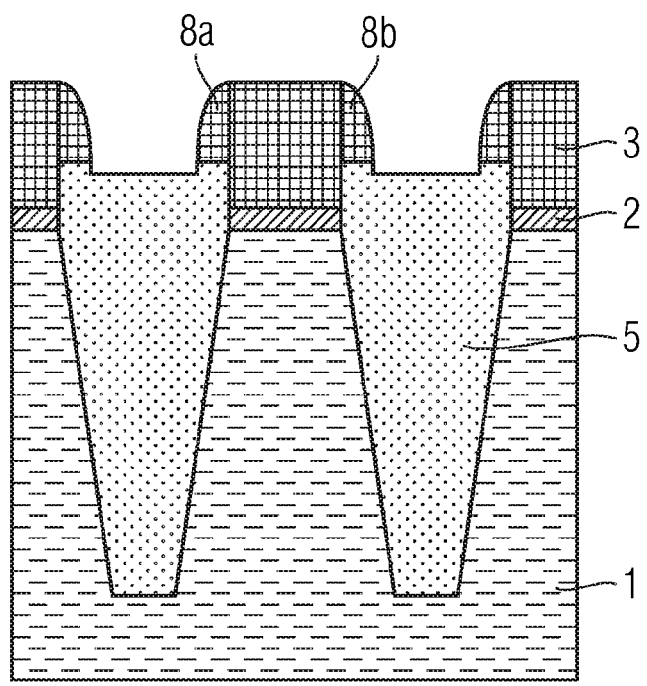

In the next step, the first and second conductive layers 3, 8 may be separated in subareas located substantially on top of a dividing wall between two adjacent trenches 5, according to one embodiment of the invention, as shown in FIG. 8. Separation of the subareas of the first and second conductive layers 3, 8 may be achieved by etching at least the second conductive layer 8. The second conductive layer 8 may be removed from any horizontal surface of the insulating compound 6 and the first conductive layer 3. As a result, spacers 9a and 9b may be formed from the remaining parts of the second conductive layer 8. Spacers 9a and 9b are formed on the left-hand side and the right-hand side of any subarea of the first conductive layer 3 respectively. The etching process which is used to remove parts of the second conductive layer 8 may or may not remove also parts of the insulating compound 6.

In one embodiment of the invention, the etching of the second conductive layer 8 may be performed by an anisotropic dry-etching process performed by a reactive plasma. Ions and neutral particles emerging from the reactive plasma may be accelerated in a direction perpendicular to the surface of the substrate 1. Therefore, the etching of the second conductive layer 8 may be stronger in the direction perpendicular to the impinging ions than in the direction parallel to the ion tracks.

In still another embodiment of the invention, the plasma may additionally include a polymerizable component such as silane, hexamethyldisilane, acetylene or the like in order to provide a protective layer on the parts of the second conductive layer 8 which may form the spacer elements 9a and 9b. In case that unwanted residues of the polymerizable component are deposited at parts of the spacer elements 9a, 9b, the second surface of the first insulating layer 3 or the surface of the insulating component 5, a further step for cleaning the surfaces may be added. This cleaning step may involve an etching or a washing of the surface with a solvent and/or de-ionized water. The cleaning step may be chosen by those skilled in the art depending on the polymerizable component used and the protective layer deposited from this components.

Figure 9:
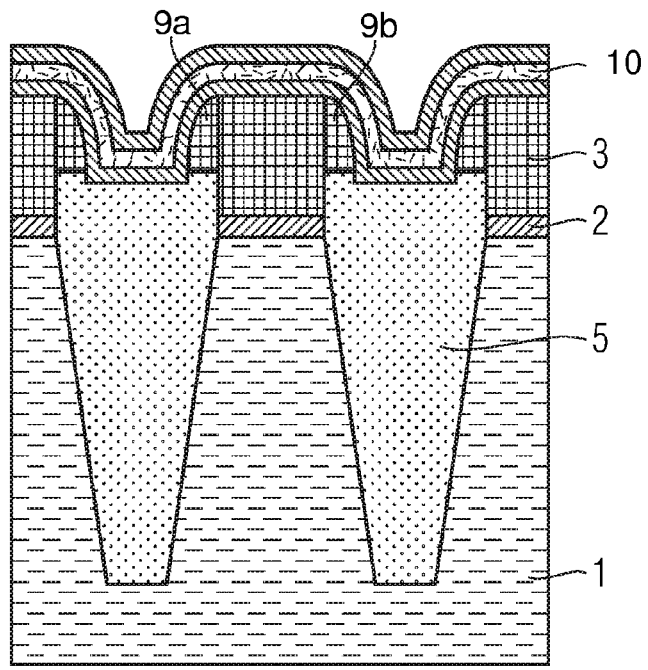

Parts of the first conductive layer 3 and the spacer elements 9a and 9b may form a floating gate as a part of a storage cell. This floating gate may be separated by substrate 1 by means of the first insulating layer 2 and the insulating compound 6. In order to insulate also the upper part of the floating gate from subsequent layers, a second insulating layer 10 may be applied, according to one embodiment of the invention, as shown in FIG. 9.

In one embodiment of the invention, the second insulating layer 10 may be made from an insulator with a high dielectric constant, i.e. the dielectric constant may be higher than 7. Such an insulator may be obtained from any of an aluminum oxide, a hafnium oxide, a silicon oxide, a tantalum oxide or a silicon nitride.

In another embodiment of the invention, the second insulating layer 10 may be made from a multi-layer structure which is composed of at least two single insulating layers. In one embodiment of the invention, such a multi-layer structure may be obtained from a silicon oxide layer, a silicon nitride layer and a second silicon oxide layer. Additional layers for increasing the adhesion or for minimizing a lattice mismatch can be included.

Figure 10:
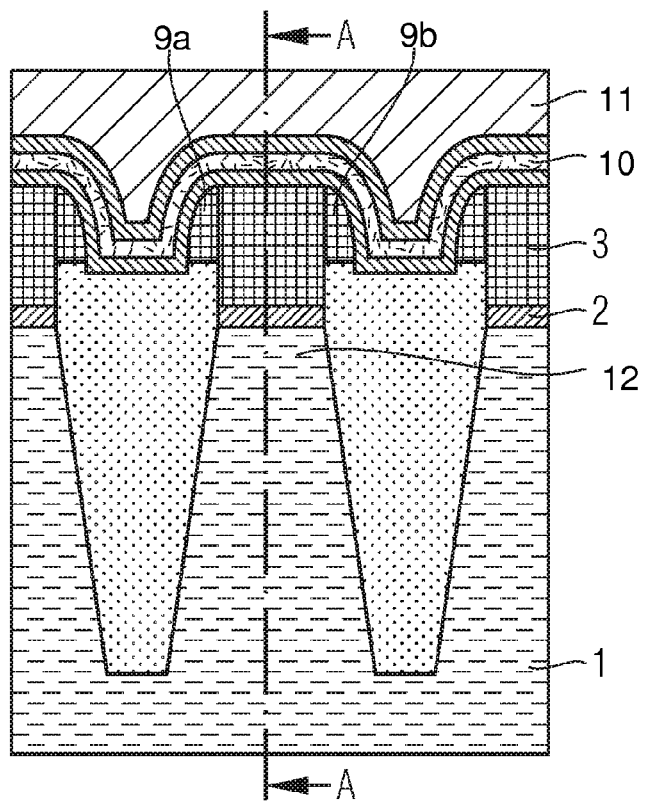

With reference to FIG. 10, the formation of a control gate and a word line to address the storage cell is explained, according to one embodiment of the invention. The control gate and the word line are provided by a third conductive layer 11 which may be applied over the second insulating layer 10. The control gate 11 is in close contact with the floating gate, separated only by the second insulating layer 10. The area of contact is increased by means of the side faces of the spacer elements 9a and 9b. Therefore, the floating gate 3, 9a, 9b described allows for good capacitive coupling with the control gate 11. On the other hand, the capacitive coupling of control gate 11 to the channel region 12 may be suppressed as the electric field generated by control gate 11 may be blocked the spacer elements 9a and 9b.

The formation of the third conductive layer 11 may be performed in the same manner as the formation of any of the first or the second conductive layers 3, 8. In another embodiment of the invention, a different method for the formation of the third conductive layer may be used. In one embodiment, the third conductive layer 11 may include polycrystalline silicon with or without a dopant such as boron, aluminum, gallium, nitrogen, phosphorus or arsenic. In another embodiment, the third conductive layer 11 may include a metal or an alloy. In this case, the third conductive layer 11 may include aluminum, titanium, copper, gold or a combination thereof. The third conductive layer 11 may consist of a plurality of layers with a different elementary composition. The conductive layer 11 may be deposited by means of a physical vapor deposition or a chemical vapor deposition.

Figure 11:
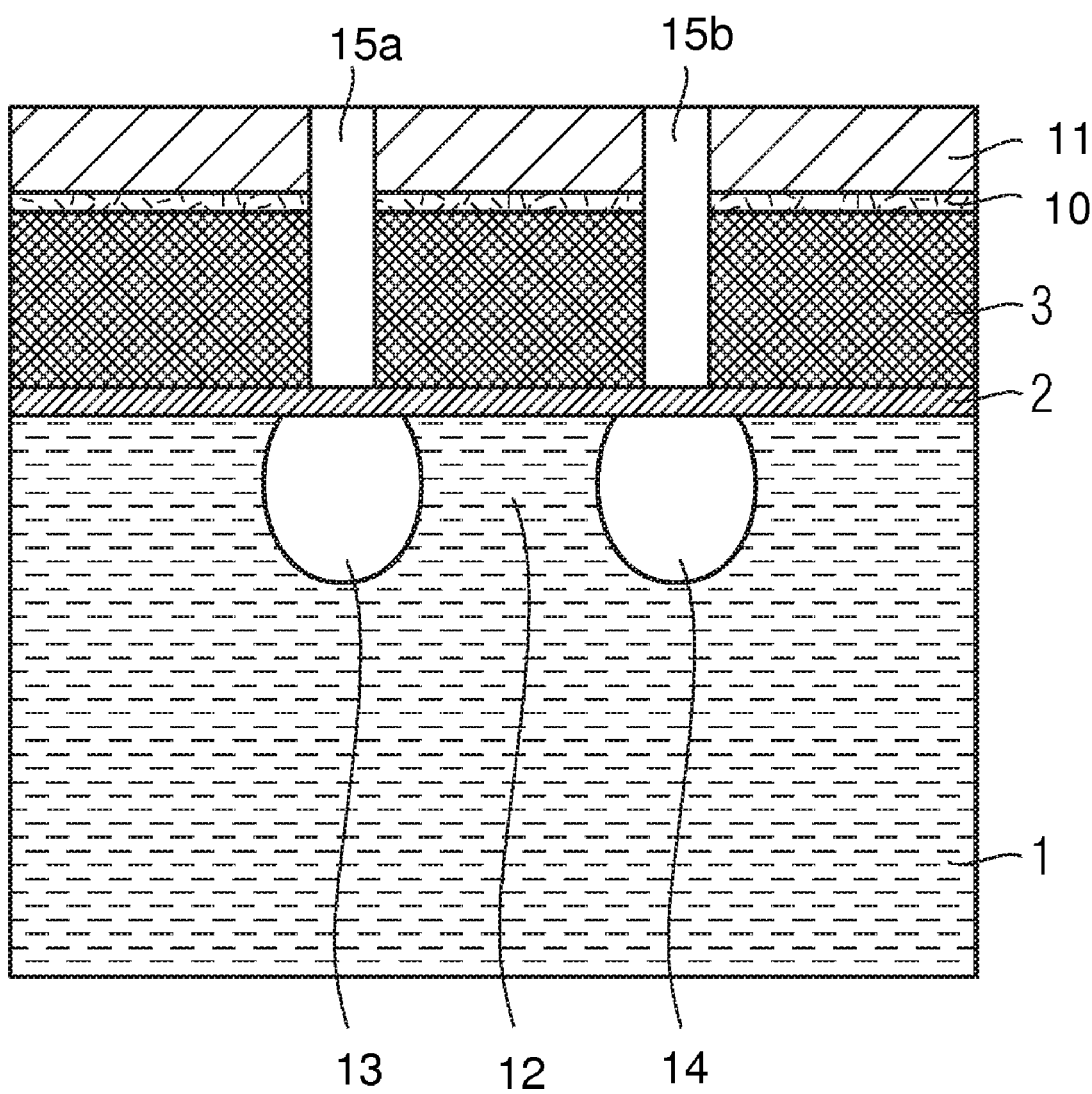
FIG. 11 illustrates a cross-sectional view through a part of a semiconductor die after some method steps during manufacturing of a storage cell have been completed, according to one embodiment of the invention. The cross-sectional view is carried out in a direction perpendicular to the cross sections shown in FIGS. 1 to 10.

FIG. 11 shows another cross-sectional view in a plane substantially perpendicular to the section shown in FIGS. 1 to 10, according to one embodiment of the invention. The section line is indicated in FIG. 10 as dashed line and marked with arrows A-A. FIG. 11 shows the cross-section of an integrated circuit after performing additional manufacturing steps.

By masking and etching the surface of the third conductive layer 11, trenches 15a and 15b may be applied to the third conductive layer 11, the second insulating layer 10, first conductive layer 3 and spacer elements 9a and 9b. After performing the etching of trenches 15a and 15b, the masking layer may be removed. Therefore, the masking layer is not detailed in FIG. 11.

By applying trenches 15a, 15b, . . . 15n, which may be aligned substantially perpendicular to the first trenches filled with insulating compound 6, the elongated dividing wall between adjacent trenches filled with insulating compound 6 may be divided into a plurality of storage elements, each storage element including an active area 12.

By dividing the surface of the integrated circuit in a first set of trenches filled with an insulating compound 6 and a second set of trenches 15a, 15b, . . . 15n perpendicular to the first trenches, a matrix-like structure of a plurality of storage cells may be formed.

In order to allow a current to flow through the channel region 12, a source contact 13 and a drain contact 14 are formed. These source and drain contacts 13, 14 include at least one doped region in the substrate 1.

In one embodiment of the invention, the doped region may be obtained by implanting accelerated ions through the trenches 15a, 15b and the first insulating layer 2 into the substrate 1. The kinetic energy of the accelerated ions may be varied in order to vary the concentration and the depth of the implanted ions. The integrated circuit may be annealed in order to activate the implanted ions. With respect to this invention, an activation of an ion means that this ion acts as a shallow donor or a shallow acceptor which allows an electric current to flow inside the doped region 13, 14.

In another embodiment of the invention, the doped regions 13, 14 may be obtained by any other suitable doping method known in the art before applying the first insulating layer 2, the first conductive layer 3 and the masking layer 4.

The storage cell shown in FIG. 11 has a function very similar to a MOS-transistor. The first insulating layer 2, the source contact 13 and the drain contact 14 delimit a channel region 12. The electric resistance in this channel region may be controlled by an electric field which is applied by a charge stored on the floating gate formed by parts of the first conductive layer 3 and the spacer elements 9a and 9b. A circuitry not shown in the drawings may be able to determine the resistivity of the channel region 12.

Dependent on the value of resistivity obtained, either a first or a second logical state is assigned to the respective storage cell. In another embodiment, more than two different logic states can be determined by defining more than one threshold for the value of resistivity of the channel region.

In order to change the logical state, a charge may be applied to the floating gate made of first conductive layer 3 and spacer elements 9a and 9b. This can be done by applying an electric field to the control gate 11 which couples capacitively to the floating gate.

Although the invention has been described by referring to a single memory cell, those skilled in the art will recognize that a plurality of similar memory cells may be formed on a substrate. These memory cells may be formed at any dividing wall between any pair of trenches filled with an insulating compound 6. A plurality of such dividing walls may be formed in a substrate substantially parallel to each other. Each dividing wall may be divided by additional trenches 15a, 15b to carry a plurality of memory cells. By this measure, several hundreds or several thousands up to millions of storage cells may be formed on a single substrate.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

Many methods for forming the necessary layers are known to those skilled in the art such as chemical vapour deposition, physical vapour deposition, spin coating or reactive sputtering techniques. These methods are equally effective when practicing the present invention. They have not been described in detail in order not to obscure the core of the present invention. Further method steps such as annealing or cleaning of the substrate prior or after the deposition of a layer may be included when forming any of the first insulating layer 2, the first conductive layer 3, the second conductive layer 8, the third conductive layer 9 the second insulating layer 10 or the masking layer 4.

What is claimed is:

1. A method for manufacturing an integrated circuit comprising at least one storage cell, the method comprising:
   providing a substrate having a first side and an opposing second side, the substrate comprising a plurality of trenches parallel to each other so that at least one dividing wall is formed between two adjacent trenches;
   filling the trenches with an insulating compound;
   providing a first insulating layer having a first side and an opposing second side on a top surface of at least one dividing wall wherein the first side of the first insulating layer is arranged on the first side of the substrate;
   providing a first conductive layer having a first side, an opposing second side, and side faces arranged from the first side and second side of the first conductive layer, wherein the first side of the first conductive layer is arranged on the second side of the insulating layer, wherein the first conductive layer protrudes at least partially above the insulating compound;
   providing a second conductive layer having a first side and an opposing second side, wherein the first side of the second conductive layer contacts at least a part of the second side and the side faces of the first conductive layer; and
   removing parts of the second conductive layer by means of an anisotropic etching.

2. The method according to claim 1, wherein the trenches are obtained by etching the first conductive layer, the insulating layer and the substrate in presence of a structured masking layer, wherein the masking layer has a first side and a second side and the first side of the masking layer is arranged on the second side of the first conductive layer.

3. The method according to claim 2, further comprising removing the masking layer and parts of the insulating compound filling the trenches, so that at least parts of the first conductive layer being arranged on top of the dividing walls are protruding from the surface level.

4. The method according to claim 1, further comprising removing at least parts of the second conductive layer which are located adjacent to the insulating compound.

5. The method according to claim 1, wherein removing parts of the second conductive layer is done without a further masking layer.

6. The method according to claim 1, further comprising depositing a second insulating layer having a first side and a second side, wherein the first side of the second insulating layer is arranged on the second side of the second conductive layer and the insulating compound.

7. The method according to claim 6, further comprising depositing a third conductive layer having a first side and a second side, wherein the first side of the third conductive layer is arranged on the second side of the second insulating layer.

8. The method according to claim 7, further comprising depositing a second masking layer and inserting a plurality of trenches parallel to each other and perpendicular to the first set of trenches into the second masking layer, the first and second and third conductive layers and the second insulating layer and the insulating compound by structuring the masking layer and etching the first conductive layer, the insulating layer and the substrate, so that at least one dividing wall is formed between two adjacent trenches.

9. The method according to claim 8, further comprising forming at least two doped regions in the substrate by implanting ions through the first insulating layer in order to form at least one drain electrode and at least one source electrode.

10. The method according to claim 8, wherein any of the first or second masking layer comprises a silicon nitride compound and any of the layers is removed by an etching process.

11. The method according to claim 7, wherein any of the first or second or third conductive layer comprises polycrystalline silicon.

12. The method according to claim 7, wherein any of the first or second or third conductive layer is provided by a chemical vapour deposition.

13. The method according to claim 1, wherein the first insulating layer comprises a silicon oxide.

14. The method according to claim 1, wherein the insulating compound comprises an oxide.

15. The method according to claim 1, wherein the insulating compound is provided by any of a spin coating process or a chemical vapour deposition.

* * * * *